United States Patent
Waheed et al.

(10) Patent No.: US 8,150,335 B2
(45) Date of Patent: Apr. 3, 2012

(54) APPARATUS AND METHOD FOR ADAPTIVE CARTESIAN TRANSMITTER LINEARIZATION AND WIRELESS TRANSMITTER EMPLOYING THE SAME

(75) Inventors: Khurram Waheed, Plano, TX (US); Seydou N. Ba, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 672 days.

(21) Appl. No.: 12/193,104

(22) Filed: Aug. 18, 2008

(65) Prior Publication Data
US 2009/0054016 A1 Feb. 26, 2009

Related U.S. Application Data

(60) Provisional application No. 60/957,122, filed on Aug. 21, 2007.

(51) Int. Cl.
*H04B 1/04* (2006.01)
*H04K 3/00* (2006.01)

(52) U.S. Cl. ..................................... 455/114.3; 375/296

(58) Field of Classification Search ............... 455/114.3, 455/126; 375/296–297
See application file for complete search history.

(56) References Cited

U.S. PATENT DOCUMENTS

| 5,923,712 A * | 7/1999 | Leyendecker et al. ........ 375/297 |
| 7,372,918 B2 * | 5/2008 | Muller et al. .................. 375/296 |
| 2008/0174365 A1 * | 7/2008 | Yang et al. .................... 330/149 |

OTHER PUBLICATIONS

U.S. Appl. No. 12/193,186, filed Aug. 18, 2008; Apparatus and Method for Adaptive Polar Transmitter Linearization and Wireless Transmitter Employing the Same; Khurram Waheed, et al.

* cited by examiner

*Primary Examiner* — Lee Nguyen
(74) *Attorney, Agent, or Firm* — Wade J. Brady, III; Frederick J. Telecky, Jr.

(57) ABSTRACT

A Cartesian transmitter and a method of linearizing a Cartesian transmitter. In one embodiment, the transmitter includes: (1) a transmit chain configured to receive an input signal having in-phase and quadrature components and having a predistorter configured to employ at least one compensation lookup table to carry out in-phase and quadrature compensation predistortion with respect to the input signal, a combiner configured to combine outputs of the predistorter and a non-linear element configured to process an output of the combiner, (2) a receiver coupled to the transmit chain and (3) predistortion compensation circuitry associated with the receiver and configured to update the at least one compensation lookup table based on the input signal and a signal from the receiver.

29 Claims, 14 Drawing Sheets

APPARATUS AND METHOD FOR ADAPTIVE CARTESIAN TRANSMITTER LINEARIZATION AND WIRELESS TRANSMITTER EMPLOYING THE SAME

CROSS-REFERENCE TO PROVISIONAL APPLICATION

This application claims the benefit of U.S. Provisional Application Ser. No. 60/957,122, filed by Waheed, et al., on Aug. 21, 2007, entitled "Method and Apparatus for Adaptive Memoryless Cartesian Transmitter Linearization," commonly assigned with the invention and incorporated herein by reference.

TECHNICAL FIELD OF THE INVENTION

The invention is directed, in general, to wireless transmitters and, more specifically, to an apparatus and method for adaptive Cartesian transmitter linearization and a wireless transmitter employing the apparatus or the method.

BACKGROUND OF THE INVENTION

Many applications exist for battery-powered, digital wireless transmitters, primarily in cellular communications systems such as those operating under the International Telecommunication Union's Wideband Code Division Multiple Access (WCDMA) standard. Such transmitters use one or more amplifiers, such as a digital pre-power amplifier (PPA) and an external power amplifier (PA), to amplify components of the input signal to be transmitted. These components are in-phase and quadrature components in the case of a Cartesian transmitter.

A highly linear amplifier distorts the signal the least and so is most favored from a standpoint of signal quality. Unfortunately, highly linear amplifiers use relatively large amounts of power and numbers of highly accurate and tightly matched components, making them relatively power consumptive, large and expensive. Though they perform the best, they are thus disfavored in many wireless applications, particularly those that require low-cost transmitters or transmitters that are subject to large operating voltage excursions. The amplifier that is best suited overall for low-cost, battery-powered wireless transmitters is a simpler amplifier having significant nonlinearities. See, for example, FIG. 1A, in which a nonlinear amplifier 110 distorts a substantially sinusoidal input signal.

Predistortion is often used to compensate for these nonlinearities, resulting in a linearization of the output of the amplifier. The theory underlying predistortion is that, if an amplifier's distortion characteristics are known in advance, an inverse function can be applied to an input signal to predistort it before it is provided to the amplifier. Though the amplifier then distorts the signal as it amplifies it, the predistortion and the amplifier distortion essentially cancel one another, resulting in an amplified, output signal having substantially reduced distortion. See, for example, FIG. 1B, in which a digital predistorter 120 predistorts the substantially sinusoidal input signal such that the output signal is likewise sinusoidal.

In digital transmitters, digital predistortion (DPD) is most often carried out using a lookup table (LUT) that associates output values with input signal values. Entries in the LUT are addressed using samples of the input signal. The output values retrieved from the LUT are used either to modify the samples (an "inverse gain" configuration) or in lieu of the samples (a "direct mapping" configuration). In modern applications such as WCDMA, samples are transmitted at a very high rate. Thus, the predistorter needs to be able to look up and retrieve output values very quickly.

WCDMA Cartesian transmitters suffer nonlinearities resulting from both amplitude modulation (AM) and phase modulation (PM), namely AM-AM and AM-PM interactions, occurring in their amplifier(s). In such Cartesian transmitters, predistortion is carried out at least partially to negate the effect of these interactions.

Values for a nominal predistortion LUT are typically computed during initial factory calibration. Unfortunately, a factory-calibrated predistortion LUT often fails to linearize the amplifier(s) adequately under varying operational conditions (e.g., temperature, voltage, frequency and voltage standing-wave ratio, or VSWR). Aging, especially in WCDMA and other so-called "3G" transmitters, only exacerbates the inadequacy.

SUMMARY OF THE INVENTION

To address the above-discussed deficiencies of the prior art, the invention provides a Cartesian transmitter and a method of linearizing a Cartesian transmitter. In one embodiment, the transmitter includes: (1) a transmit chain configured to receive an input signal having in-phase and quadrature components and having a predistorter configured to employ at least one compensation LUT to carry out in-phase and quadrature compensation predistortion with respect to the input signal, a combiner configured to combine outputs of the predistorter and a nonlinear element configured to process an output of the combiner, (2) a receiver coupled to the transmit chain and (3) predistortion compensation circuitry associated with the receiver and configured to update the at least one compensation LUT based on the input signal and a signal from the receiver.

Another aspect of the invention provides a method of linearizing a Cartesian transmitter. In one embodiment, the method includes: (1) receiving an input signal having in-phase and quadrature components, (2) employing at least one compensation LUT to carry out in-phase and quadrature compensation predistortion with respect to the input signal, (3) combining the predistorted in-phase and quadrature components, (4) thereafter processing the combined in-phase and quadrature components with a nonlinear element and (5) updating the at least one compensation LUT by initializing a compensation LUT based on a signal from a receiver, computing an adaptation error, computing an update to corresponding LUT entries and updating the corresponding LUT entries.

Yet another aspect of the invention provides a WCDMA Cartesian transmitter. In one embodiment, the WCDMA transmitter includes: (1) a transmit chain configured to receive an input signal having in-phase and quadrature components and having a predistorter configured to employ at least one compensation LUT to carry out in-phase and quadrature compensation predistortion with respect to the input signal, a nonlinear combiner configured to combine outputs of the predistorter, a nonlinear pre-power amplifier configured to amplify an output of the combiner and a nonlinear power amplifier configured to amplify an output of the pre-power amplifier to yield an output signal, (2) a receiver coupled to the transmit chain and (3) predistortion compensation circuitry associated with the receiver and configured to update the at least one compensation LUT based on the input signal and a signal from the receiver.

In another embodiment, the WCDMA transmitter includes: (1) a transmit chain configured to receive an input signal having in-phase and quadrature components and having a predistorter configured to employ at least one compensation LUT to carry out in-phase and quadrature compensation predistortion with respect to the input signal, a nonlinear combiner configured to combine outputs of the predistorter, a nonlinear pre-power amplifier configured to amplify an output of the combiner and a nonlinear power amplifier configured to amplify an output of the pre-power amplifier to yield an output signal, (2) a receiver coupled to the transmit chain, (3) predistortion compensation circuitry associated with the receiver and configured to update the at least one compensation LUT based on the input signal and a signal from the receiver, (4) an adaptation engine associated with the predistortion compensation circuitry and configured to employ an iterative adaptation algorithm to reduce a difference between delayed signals provided thereto and (5) a quality monitor associated with the adaptation engine and configured to carry out a selected one of: (5a) regulating predistortion operational parameters, (5b) enabling or disabling the adaptation engine, (5c) controlling switching of predistortion compensation LUTs and (5d) performing other sequencing operations.

BRIEF DESCRIPTION OF THE DRAWINGS

For a more complete understanding of the invention, reference is now made to the following descriptions taken in conjunction with the accompanying drawings, in which.

DETAILED DESCRIPTION

Various embodiments of a predistortion technique for a Cartesian transmitter will be described herein. Transmitter nonlinearity is potentially caused by saturation-induced compression in its digital-to-analog converter (DAC), group and phase delay distortions in filters, datapath mismatches in Cartesian signal processing and AM-AM and AM-PM nonlinearities in one or both of the PPA (sometimes referred to as a PA driver) and the external PA. These nonlinearities distort the I/Q signal constellation that is transmitted by the transmitter (TX), thus causing poor error vector magnitude (EVM) and spectral degradation, which is observed as a degradation of the adjacent channel leakage power/ratio (ACLP/ACLR) and possibly increased broadband noise.

Certain embodiments of the predistortion technique are on-line and employ indirect learning adaptation. Certain embodiments of the on-line, indirect learning adaptation predistortion technique are appropriate for a 2G or 3G (e.g., EDGE, WCDMA or UMTS) Cartesian transmitter. In one embodiment to be illustrated and described, the predistortion LUT that is located in the transmit chain is divided into a calibration (static) LUT and a compensation (adaptive) LUT. An adaptation process determines an update to a second compensation LUT in a shadow memory. A quality monitor may interact with the adaptation process, e.g., to determine whether or not the update should be made. The second compensation LUT is then used in a subsequent timeslot (perhaps by a simple memory pointer change), while the (first) compensation LUT that was active in the previous timeslot is now used to compute compensation under operational transmit characteristics. A Cartesian transmitter that incorporates embodiments of the technique and a method of linearizing a Cartesian transmitter will also be described.

1 WCDMA Transmitter Linearization Budget Analysis

Figure 1A:
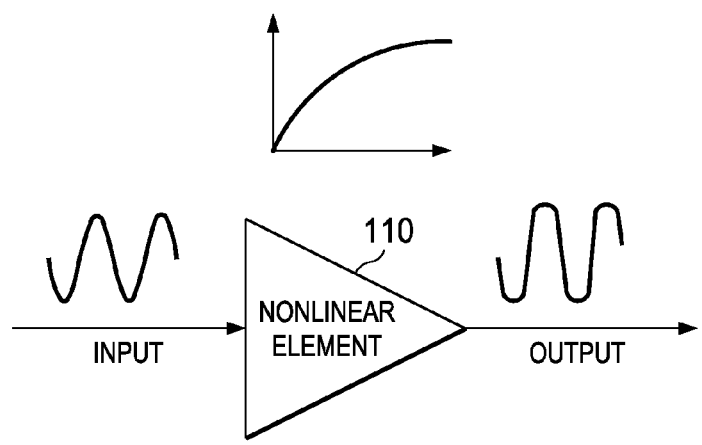
FIGS. 1A and 1B are high-level schematic diagrams showing amplifier distortion, particularly the impact of a simple compression nonlinearity on the time-domain output signal.
Figure 1B:
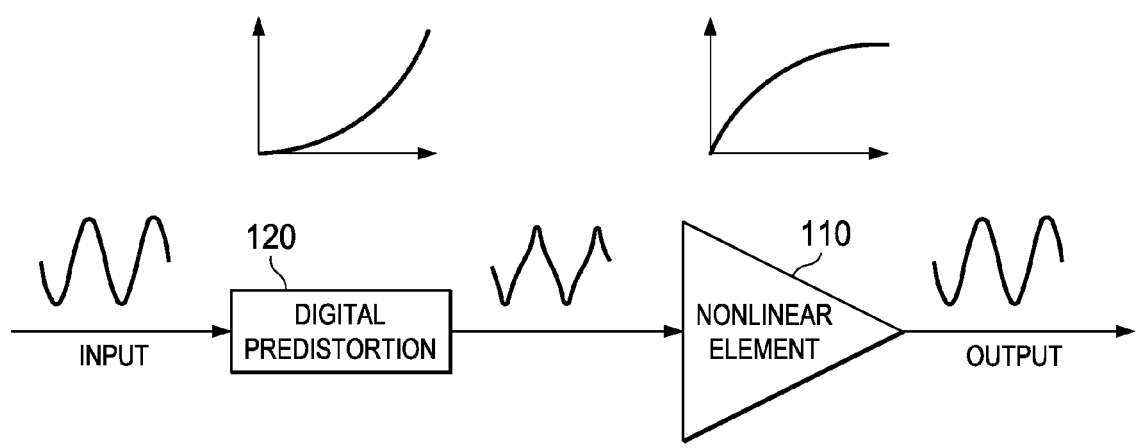
Figure 2A:
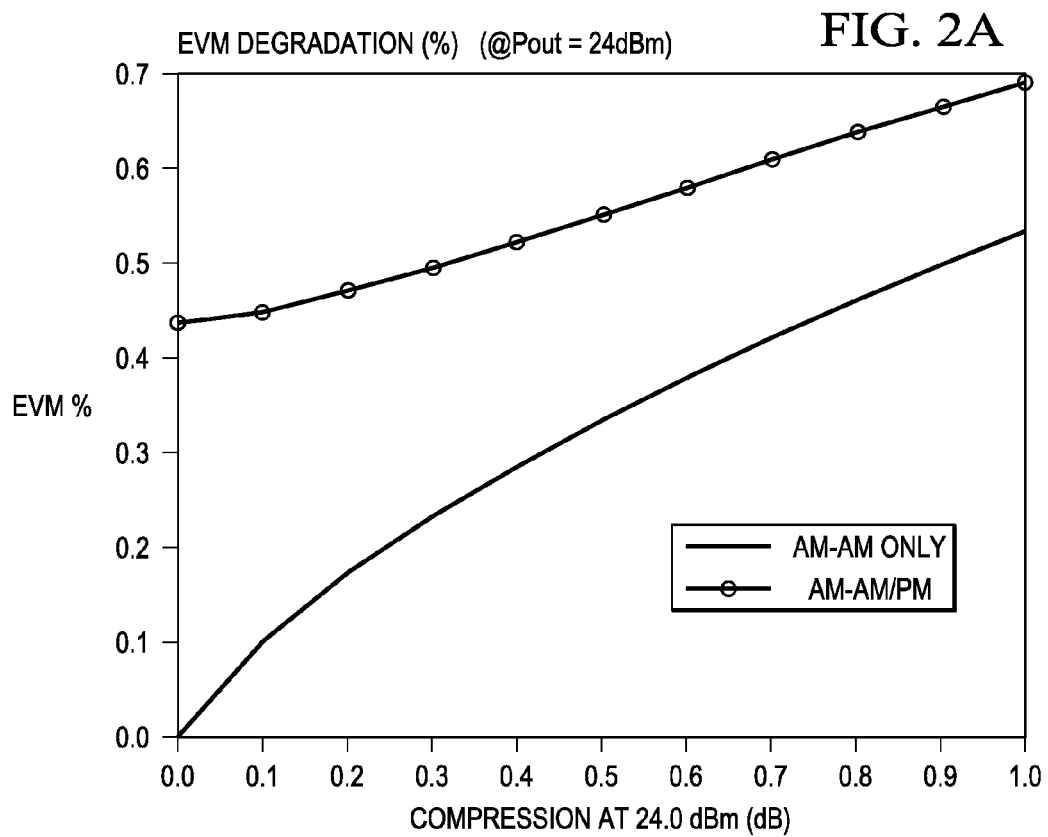
FIGS. 2A, 2B and 2C are plots showing the degradation caused by transmitter compression nonlinearity in a WCDMA transmitter in terms of error vector magnitude (EVM), a first adjacent channel leakage ratio at 5 MHz offset (ACLR1) and a second adjacent channel leakage ratio at 10 MHz offset (ACLR2), respectively.
Figure 2B:
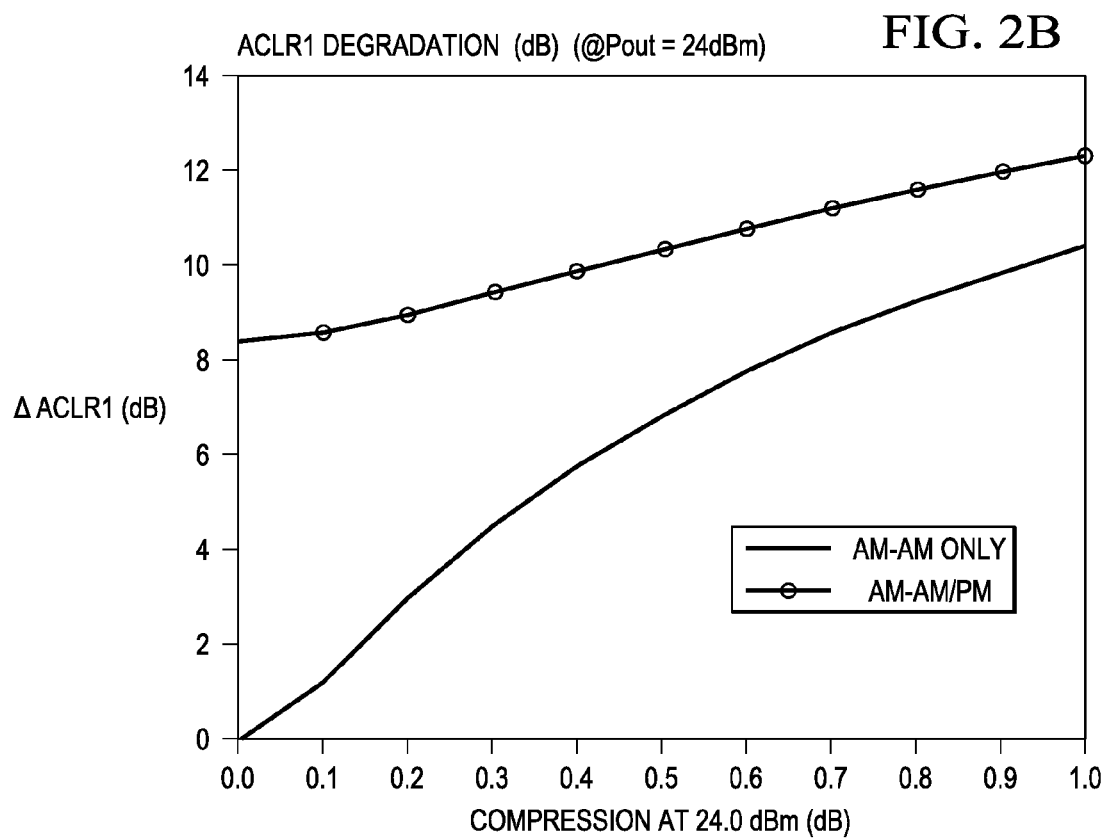
Figure 2C:
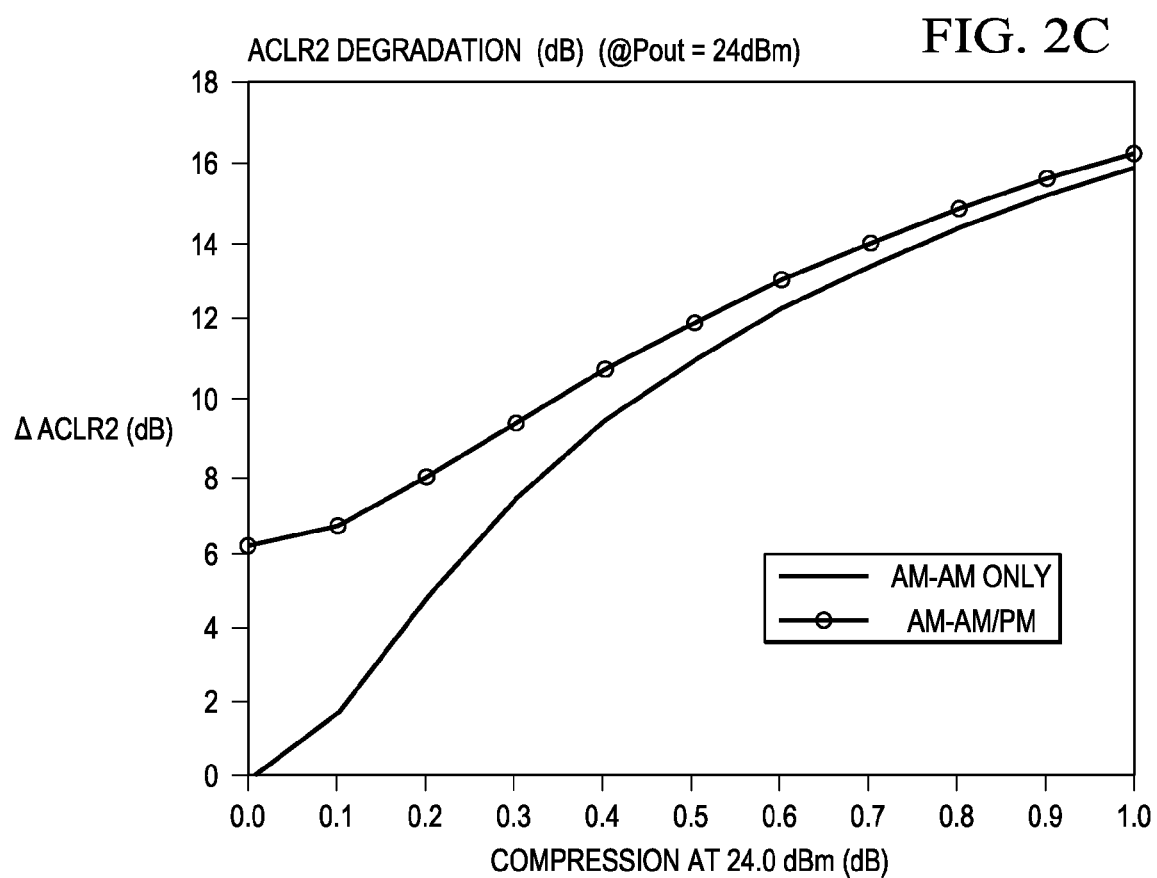

The potential effect of transmitter non-linearity on the transmitted WCDMA signal will now be described. The tolerable level of transmitter compression is determined by experimentations based on a novel AM-AM compression model and a measured PA AM-PM profile. A weakly nonlinear PA model was used to generate plots illustrating the effect of transmitter nonlinearity. This choice was made due to ease of model parameter estimation. Other memoryless or quasi-memoryless models could alternative be used. EVM, ACLR1 and ACLR2 were measured as a function of the compression level at 24 dBm. FIGS. 2A, 2B and 2C are plots showing the degradation caused by transmitter compression nonlinearity in a WCDMA transmitter in terms of EVM, ACLR1 and ACLR2, respectively. The AM-PM profile was simulated by curve fitting an actual PA's AM-PM curve.

2 Predistortion Calibration

Factory predistortion calibration is typically employed to obtain the nominal behavior of a PPA or a PPA/PA combination and thereby to construct nominal AM/AM and AM/PM predistortion LUTs.

In predistortion calibration, a ramping signal DTX is injected into the amplifier. The ramping signal typically covers the entire range of the PPA input and has the same number of steps as the size of the predistortion LUTs. Each step typically is of sufficient duration to allow the transmitter and receiver to settle. The transmitted and received data are then used to construct the calibrated predistortion LUTs.

Predistortion calibration also provides valuable information for predistortion compensation. Predistortion compensation can be done either using a raw (or filtered) LUT or a polynomial implementation.

For example, in a polynomial implementation, the order of the polynomial that is adequate for representing the nominal nonlinearity of one or a combination of amplifiers can be determined from calibration measurement data. Calibrating under varying operating conditions yields a better estimate of the order of the compensation polynomial to be used for incremental predistortion changes due to temperature, frequency, voltage and VSWR. A polynomial implementation also allows easy mathematical extrapolation of compensation if WCDMA signal dynamic range is limited (i.e., the complete predistorter dynamic range is not used).

3 Adaptive Predistortion Compensation

Various embodiments of an adaptive predistorter suitable for use with a 3G WCDMA Cartesian transmitter will now be described.

3.1 Adaptation Process

Various embodiments of the predistorter adaptation technique employ a receiver that feeds back a fraction of the transmitted WCDMA signal to a processor (e.g., a script processor). The receiver may be a main receiver of the transceiver that is time-shared to provide feedback or a auxiliary receiver that is separate from the main receiver. The latter is particularly advantageous in a duplex system, such as WCDMA. The predistorter employs static correction (via the calibration LUT) calibrated for nominal temperature operation, and an adaptive correction (via the compensation LUT) that tracks the characteristics variations due to temperature fluctuations. Both the calibrated and compensated portions of the predistorter are implemented using LUTs.

The feedback of the transmitted signal may also be configured to compensate for any output and load impedance mismatches. This might be carried out using a set of directional couplers or a mechanism of appropriate load (or antenna) impedance tuning, which provides the information as auxiliary feedback to the adaptive predistorter.

Two learning architectures will now be described: a direct learning architecture, and an indirect learning architecture.

3.1.1 Direct-Learning Architecture

Figure 3:
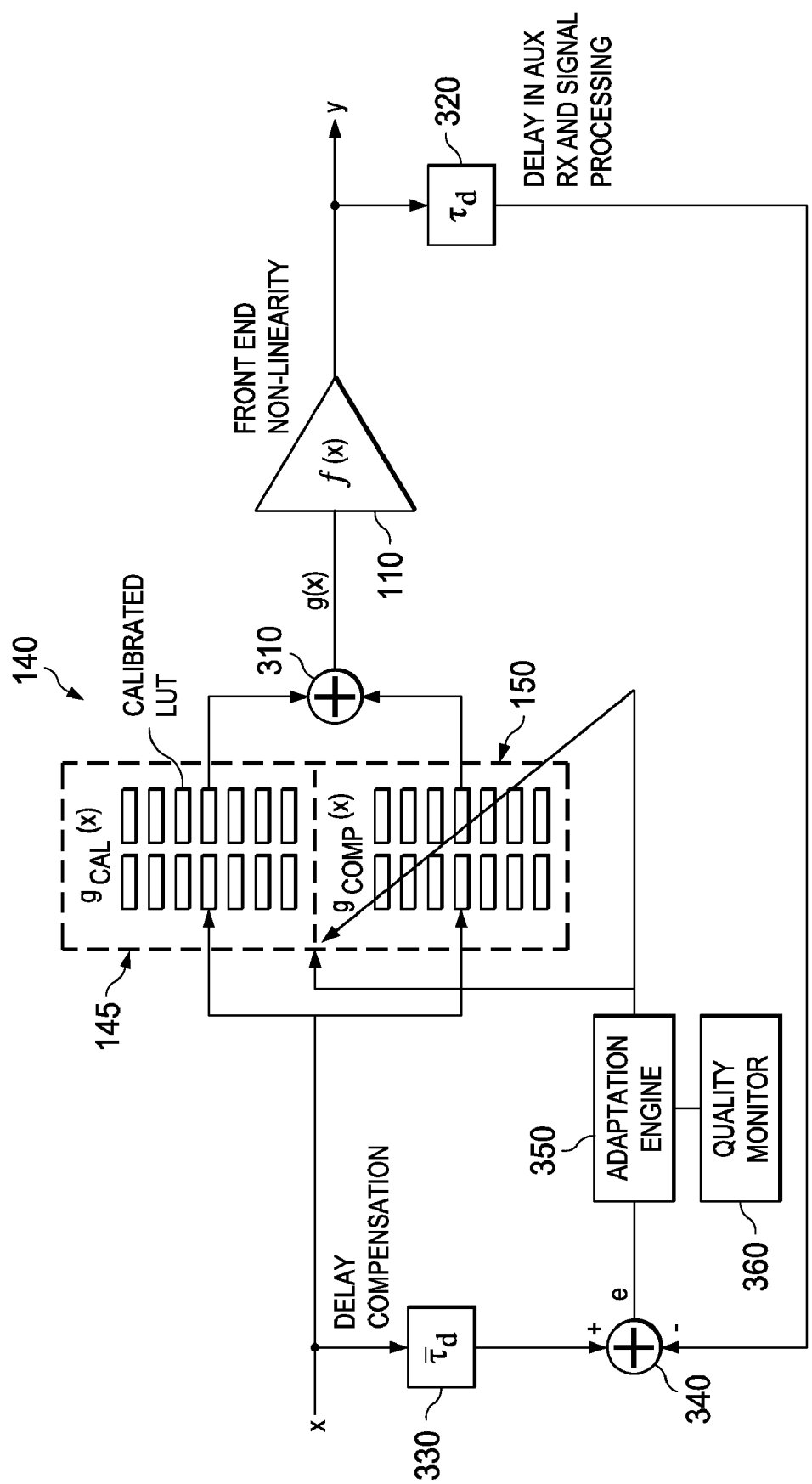
FIG. 3 is a conceptual view of one embodiment of a predistorter that employs direct learning.

FIG. 3 is a conceptual view of one embodiment of a direct learning architecture. An input signal x is provided to predistortion LUTs 140, including a calibration LUT $g_{cal}(x)$ 145 and a compensation LUT $g_{comp}(x)$ 150. The outputs of the LUTs 145, 150 are summed in a summing junction 310 and provided as input to a nonlinear element 110, which provides an output signal y. An receiver feeds back the output signal y, incurring some delay. An output delay circuit $\bar{\tau}_d$ 320 represents that delay. An input delay circuit $\tau_d$ 330 delays x by an equivalent amount, and a summing junction 340 provides the difference between the two delayed signals to an adaptation engine 350. The adaptation engine 350 uses an iterative adaptation algorithm to update the compensation LUT $g_{comp}(x)$ 150 to minimize the difference. Examples of such iterative adaptation algorithms include, but are not limited to, stochastic gradient, least-mean-square (LMS) or recursive least squares (RLS) algorithms. The compensation predistorter is adapted during transmission. The state of the compensation predistorter continually changes until a steady state is reached, when the feedback error reaches zero.

A quality monitor 360 interacts with the adaptation engine 350. In the embodiment of FIG. 3, the quality monitor 360 is an adaptive predistortion supervisory control block which may regulate the predistortion operational parameters, enable or disable the adaptation engine, control the switching of predistortion compensation LUTs as well as perform other sequencing operations of the predistortion adaptation loop. The predistortion controller may be implemented in hardware or more conveniently as firmware on an available processor, which may be available on-chip. The quality monitor 360 may use metrics including, but not limited to, transmitted power level, transceiver output impedance variations, transceiver load impedance variations and VSWR, SNR or other quality metrics of the receiver feedback signal to control the predistortion operation. Such changes to the predistortion loop may include but are not limited to the change of the adaptation step-size, tuning of reference and feedback signal time-alignment, enabling or disabling predistortion adaptation and/or keeping or discarding predistortion adaptation results to meet transmitter performance goals.

The direct learning architecture has the advantage of low memory requirements, but updating the compensated LUT at each sample step while it is used for predistortion can lead to technical implementation issues that are difficult to overcome. Furthermore the transmission chain is directly exposed to the spurious signals and interference signals that are fed back through the receiver.

3.1.2 Indirect-Learning Architecture

Figure 4:
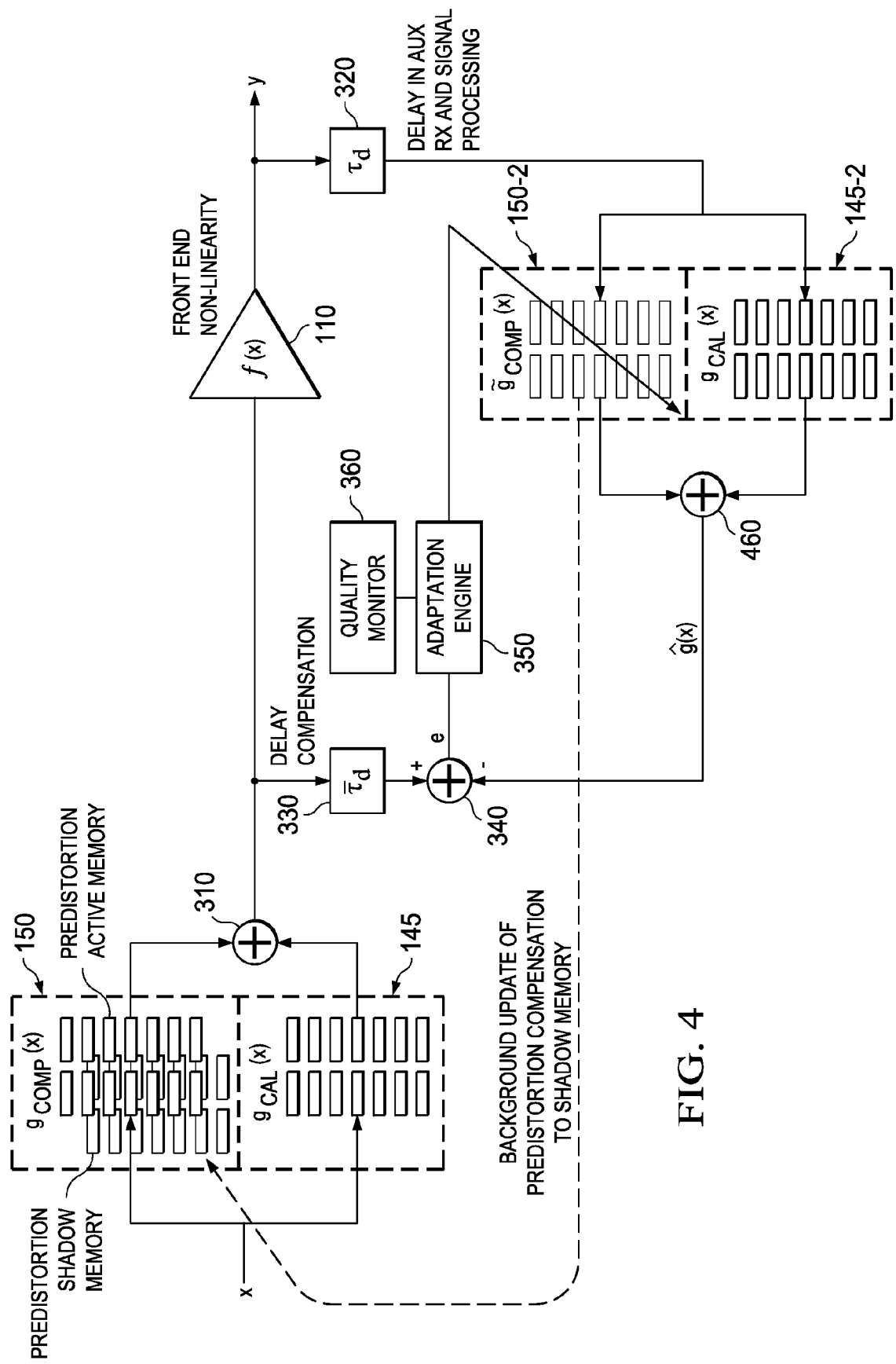
FIG. 4 is a conceptual view of one embodiment of a predistorter that employs indirect learning.

FIG. 4 is a conceptual view of one embodiment of indirect learning. Again, an input signal x is provided to predistortion LUTs 140, including a first calibration LUT $g_{cal}(x)$ 145 and a first compensation LUT $g_{comp}(x)$ 150. The outputs of the first calibration and compensation LUTs 145, 150 are summed in a summing junction 310 and provided as input to a nonlinear element 110, which provides an output signal y. An receiver feeds back the output signal y, incurring some delay. An output delay circuit $\bar{\tau}_d$ 320 represents that delay. An input delay circuit $\tau_d$ 330 delays the output of the summing junction 310 by an equivalent amount. However, unlike the direct learning architecture, the indirect learning architecture includes a second calibration LUT $g_{cal}(x)$ 145-2 and a second compensation LUT $\tilde{g}_{comp}(x)$ 150-2. The outputs of the second calibration and compensation LUTs 145-2, 150-2 are summed in a summing junction 460, yielding $\hat{g}(x)$. A summing junction 340 provides the difference between the two delayed signals to a quality monitor 350. As before, the quality monitor uses an iterative LMS-like approach to update the second compensation LUT $\tilde{g}_{comp}(x)$ 150-2 to minimize the difference. As before, the compensation predistorter is adapted during transmission. The state of the compensation predistorter continually changes until a steady state is reached, when the feedback error reaches zero. After the steady state is reached, the second compensation LUT $\tilde{g}_{comp}(x)$ 150-2 is substituted for the first compensation LUT $g_{comp}(x)$ 150. The substitution is made, or the first compensation LUT 150 is updated at selected time instants, and only when full convergence is reached.

In an indirect learning architecture, the transmission chain is insulated from the receiver's strong interference signals, as the quality monitoring system can detect and isolate them. This may be done by performing appropriate signal processing on the feedback signal or by inhibiting adaptation in the presence of a blocker. Note that a transceiver equipped with an internal feedback mechanism avoids blocker scenarios by taking the feedback from the PA back into the transceiver via an external pin. Internal feedback is limited to linearizing the transmitter chain exclusive of the PA.

Further, though the indirect learning architecture requires more memory to accommodate the first and second sets of LUTs, the decoupling between the transmit chain and the adaptation feedback loop relaxes timing requirements, allowing more flexible processing on the part of, e.g., adaptation hardware, which may include a script processor (not shown).

Figure 5:
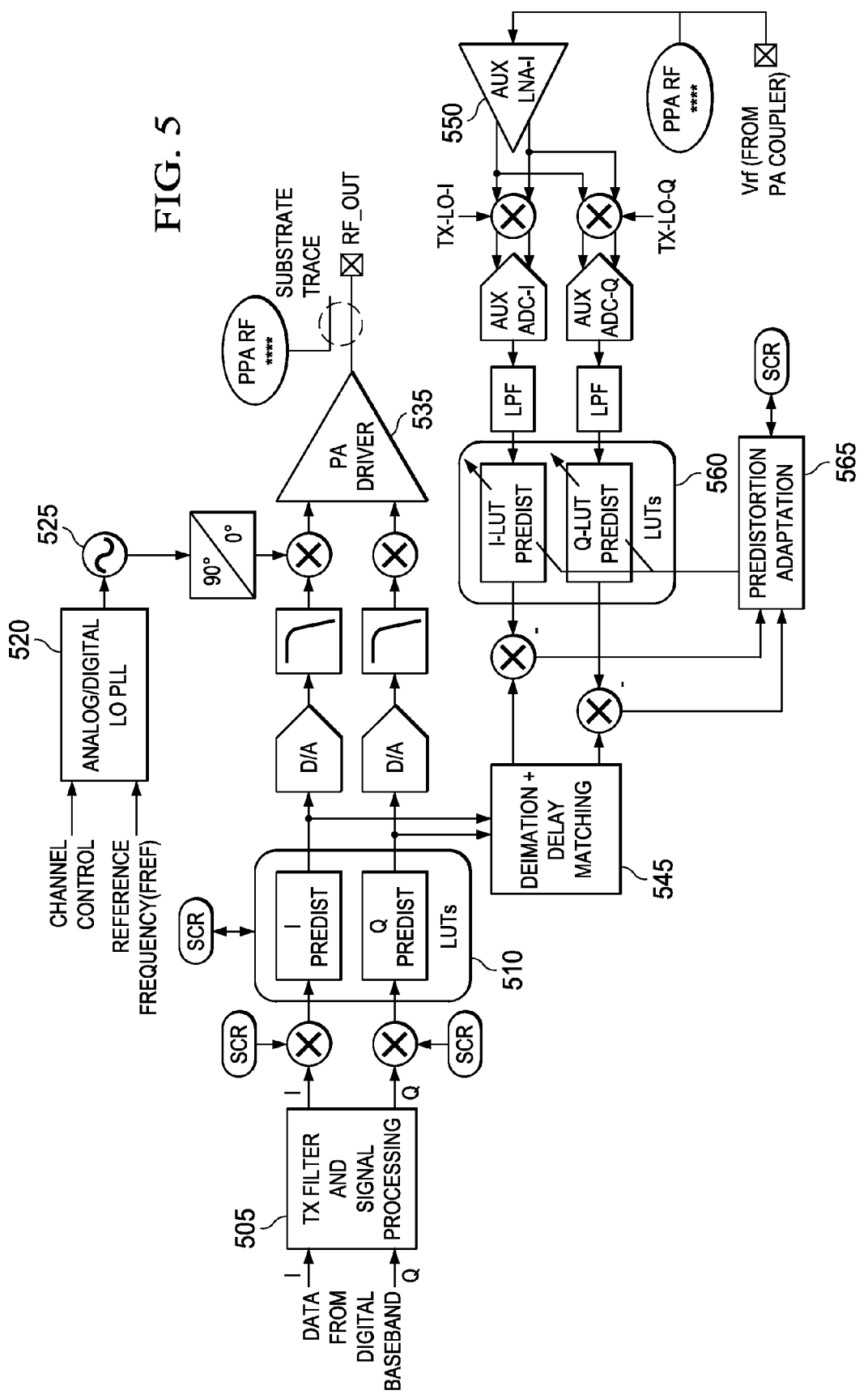
FIG. 5 is a block diagram of one embodiment of an adaptive indirect closed loop predistorter in an example of a Cartesian 3G WCDMA transmitter.

Now a particular embodiment of the indirect learning architecture will be described. FIG. 5 is a block diagram of one embodiment of an adaptive indirect closed loop predistorter in an example of a Cartesian 3G WCDMA transmitter. In FIG. 5, a digital baseband processor TXIQ produces in-phase and quadrature components I and Q. A signal processor 505 conditions I and Q for amplification. Cartesian predistortion LUTs 510 (having four LUTs—two calibration LUTs and two compensation LUTs—in the illustrated embodiment) are employed to produce predistorted amplitude and phase components $I_a$ and $Q_a$. $I_a$ and $Q_a$ are converted to analog form, filtered and modulated as shown and provided to the PPA 535, yielding the WCDMA output signal. $I_a$ and $Q_a$ are also provided to the decimator and aligner 545 to be used in temperature adaptation.

A coupler (not referenced) provides a portion of the WCDMA output signal to the input of a receiver. The receiver employs the LNA 550 to yield in-phase and quadrature components I and Q of the WCDMA output signal, which are downconverted, converted to digital form and filtered as shown. Second Cartesian predistortion LUTs 560 (having four LUTs—two calibration LUTs and two compensation LUTs—in the illustrated embodiment) predistort I and Q. The differences between these amplitude and phase components and those provided via the decimator and aligner 645 are provided to a predistortion adapter 665 which updates predistortion in the compensation LUTs of the second Cartesian predistortion LUTs 660. The second Cartesian predistortion LUTs 660 are then exchanged with the first Cartesian predistortion LUTs 140 for the next lookup. The first Cartesian predistortion LUTs 660 are updated during that next lookup, the first and second Cartesian predistortion LUTs 140, 660 are exchanged again for the lookup after that, and so on.

FIG. 5 shows direct mapping. The feedforward predistortion may be either a direct mapping (i.e., the value of an incoming complex signal determines the predistorted value) or a complex scaling term (the value of an incoming complex signal is scaled by the value in the LUT).

4 Mathematical Analysis of Cartesian Transmitter Nonlinear Transfer Function

The Cartesian transmitter of FIG. 5 features three potentially nonlinear elements in both its I and Q paths. These elements include the digital-to-analog converter (DAC), the PPA (possibly including AM-AM and AM-PM nonlinearities) and the PA (again possibly including AM-AM and AM-PM nonlinearities).

Figure 6:
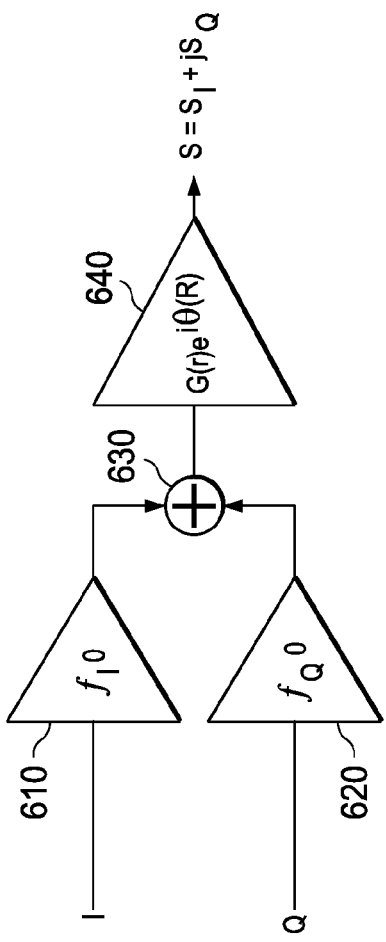
FIG. 6 is a simplified block diagram of a Cartesian transmitter.

FIG. 6 is a simplified block diagram of a Cartesian transmitter. To simplify calculations, nonlinear transfer functions of the elements are modeled by envelope-dependent complex-domain (to account for both gain and phase distortions) transfer functions $f_I(\ )$ 610 and $f_Q(\ )$ 620, respectively. A radio-frequency (RF) combiner 630 combines the output of the transfer functions, and a PA 640 amplifies the combined output. The nonlinear AM-AM and AM-PM transfer function of the RF combiner 630 and the PA 640 is modeled as a complex gain $G(r)e^{j\Theta(r)}$. In the following analysis, for mathematical convenience, it is assumed that the linear gain of the different elements is normalized to one.

Equation (1), below, gives the complex (baseband equivalent) output:

$$S = S_I + S_Q, \quad (1)$$

where $$S_I = G(\sqrt{f_I^2(I)+f_Q^2(Q)})(f_I(I) \times \cos(\Theta(\sqrt{f_I^2(I)+f_Q^2(Q)})) - f_Q(Q) \times \sin(\Theta(\sqrt{f_I^2(I)+f_Q^2(Q)})))$$

and $$S_Q = G(\sqrt{f_I^2(I)+f_Q^2(Q)})(f_Q(Q) \times \cos(\Theta(\sqrt{f_I^2(I)+f_Q^2(Q)})) + f_I(I) \times \sin(\Theta(\sqrt{f_I^2(I)+f_Q^2(Q)}))). \quad (2)$$

If the PA's AM-PM distortion is negligible, Equation (2) simplifies to:

$$S_I = G(\sqrt{f_I^2(I)+f_Q^2(Q)}) \times f_I(I) \text{ and}$$

$$S_Q = G(\sqrt{f_I^2(I)+f_Q^2(Q)}) \times f_Q(Q). \quad (3)$$

It is clear from Equations (2) and (3) above that overall nonlinearity is a function of both the transmitter I and Q paths. Therefore, the transmitter predistorter should also be function of both the I and Q components. If both the I and Q paths are well matched, and any DC offsets, gain or phase mismatch between the two paths have been eliminated by calibration, $f_I(I)=f_Q(Q)$, and the above can be simplified to:

$$S_I = G(\sqrt{2}f_I(I)) \times f_I(I)$$

$$S_Q = G(\sqrt{2}f_Q(Q)) \times f_Q(Q) \quad (4)$$

Note that for this simplified case, the I/Q paths become decoupled, and therefore the I/Q predistortion paths can be implemented as separate, noninteracting feedback loops.

In the general case, the Cartesian transmitter predistorter can now take one of the following two forms, a two-dimensional complex-mapping Cartesian predistorter and a two-dimensional predistorter of reduced complexity.

4.1 Two-Dimensional Complex-Mapping Cartesian Predistorter

Figure 7:
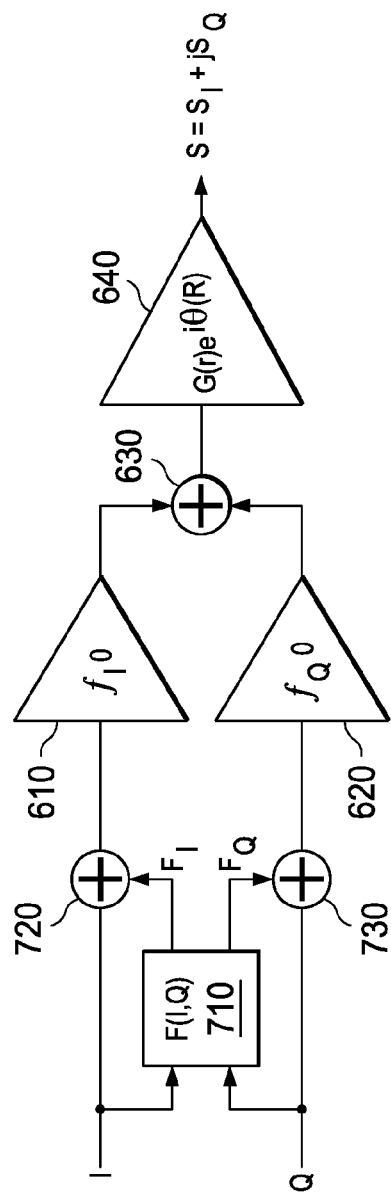
FIG. 7 is a block diagram of the Cartesian transmitter of FIG. 6 in which two-dimensional, complex-mapping predistortion is carried out.

FIG. 7 is a block diagram of the Cartesian transmitter of FIG. 6 in which two-dimensional, complex-mapping predistortion is carried out. In this configuration the predistorter carrying out F(I,Q) is a two-dimensional complex LUT 710 in a mapped configuration and indexed by |I| and |Q|. Summing junctions 720, 730 apply the output of the LUT 710 to I and Q.

Figure 8:
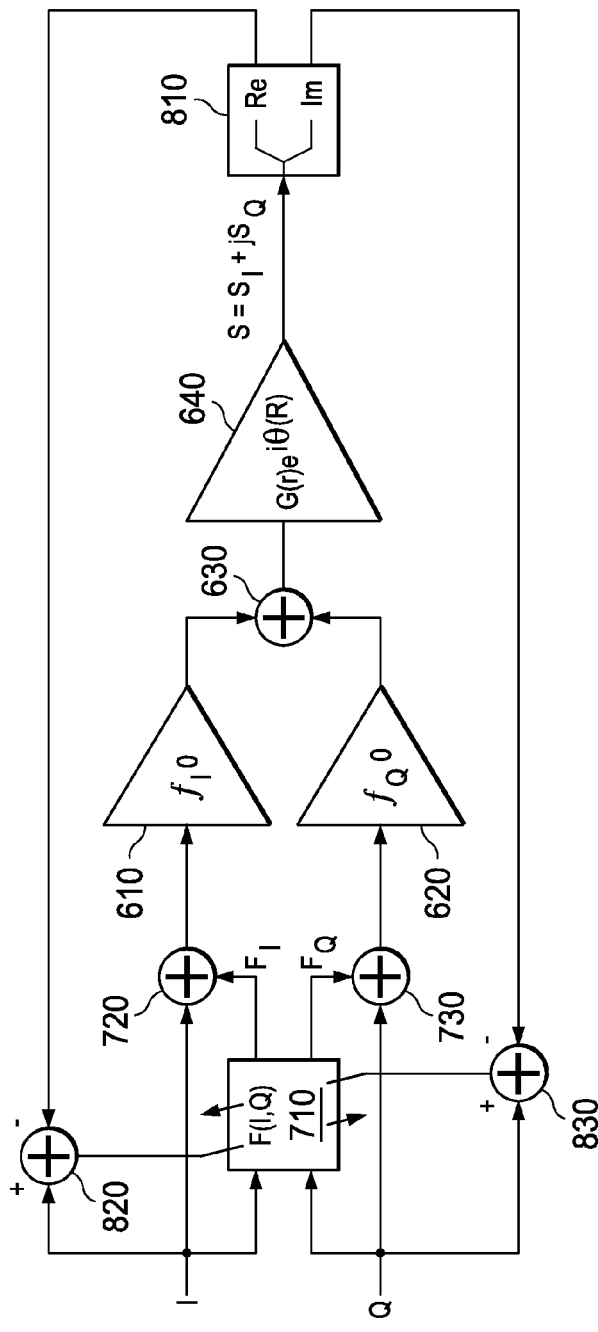
FIG. 8 is a block diagram of the Cartesian transmitter of FIG. 6 in which two-dimensional, complex-mapping predistortion with adaptation is carried out.

FIG. 8 is a block diagram of the Cartesian transmitter of FIG. 6 in which two-dimensional, complex-mapping predistortion with adaptation is carried out. The predistorter has in-phase and quadrature components $F_I$ and $F_Q$. This configuration provides a simple, single-stage predistorter and features unique feedback and adaptation paths that include a receiver that feeds back the output signal S and a splitter 810 that splits the output signal S into real and imaginary components. Summing junctions 810, 820 produce outputs that are used to update the compensation LUTs. However, due to its large dynamic range, the LUT 710 may be relatively large (e.g., 128×128 is a practical minimum for a WCDMA transmitter). Concomitant memory requirements (e.g., 16K words) may also reduce adaptation convergence speed. Bilinear interpolation may also increase overall complexity. Further, due to the instantaneous transmitted power control level (PCL) and finite peak-to-average and average-to-crest ratio of the modulation signal, bilinear interpolation may not cover the entire I/Q plane during an active slot, and it is not practical to adapt only a portion of the two-dimensional LUT predistorter.

4.2 Reduced Complexity Digital Predistortion for Cartesian Transmitter

Now, two embodiments of a two-dimensional predistorter of reduced complexity are disclosed. These embodiments simplify the overall memory requirements and complexity of digital Cartesian predistortion.

4.2.1 Cascaded One-Dimensional Cartesian Predistorter

Figure 9:
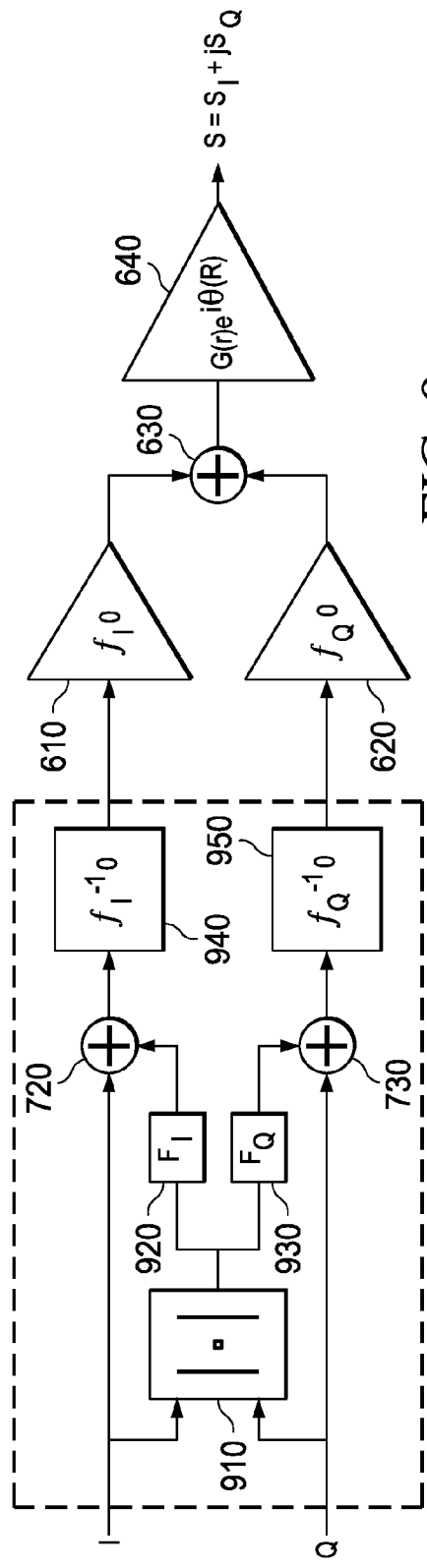
FIG. 9 is a block diagram of the Cartesian transmitter of FIG. 6 in which cascaded one-dimensional predistortion is carried out.

FIG. 9 is a block diagram of the Cartesian transmitter of FIG. 6 in which cascaded one-dimensional predistortion is carried out. An amplitude function $|\cdot|$ 910 indexes LUTs $F_I$ 920 and $F_Q$ 930 (both in an inverse gain configuration), providing the cascaded structure. Inverse transfer functions $f_I^{-1}(\ )$ 940 and $f_Q^{-1}(\ )$ 950 (both in a direct mapping configuration) are applied to the outputs of the summing junctions 720, 730, respectively. In this embodiment, the predistortion correction for the I/Q domain PA/DAC nonlinearity is divide from combiner and PA nonlinearities. As a result, the memory requirements are substantially reduced (4×128=512 words), resulting in a substantial improvement in convergence speed.

4.2.1.3 Cascaded LUT Adaptation

Figure 10:
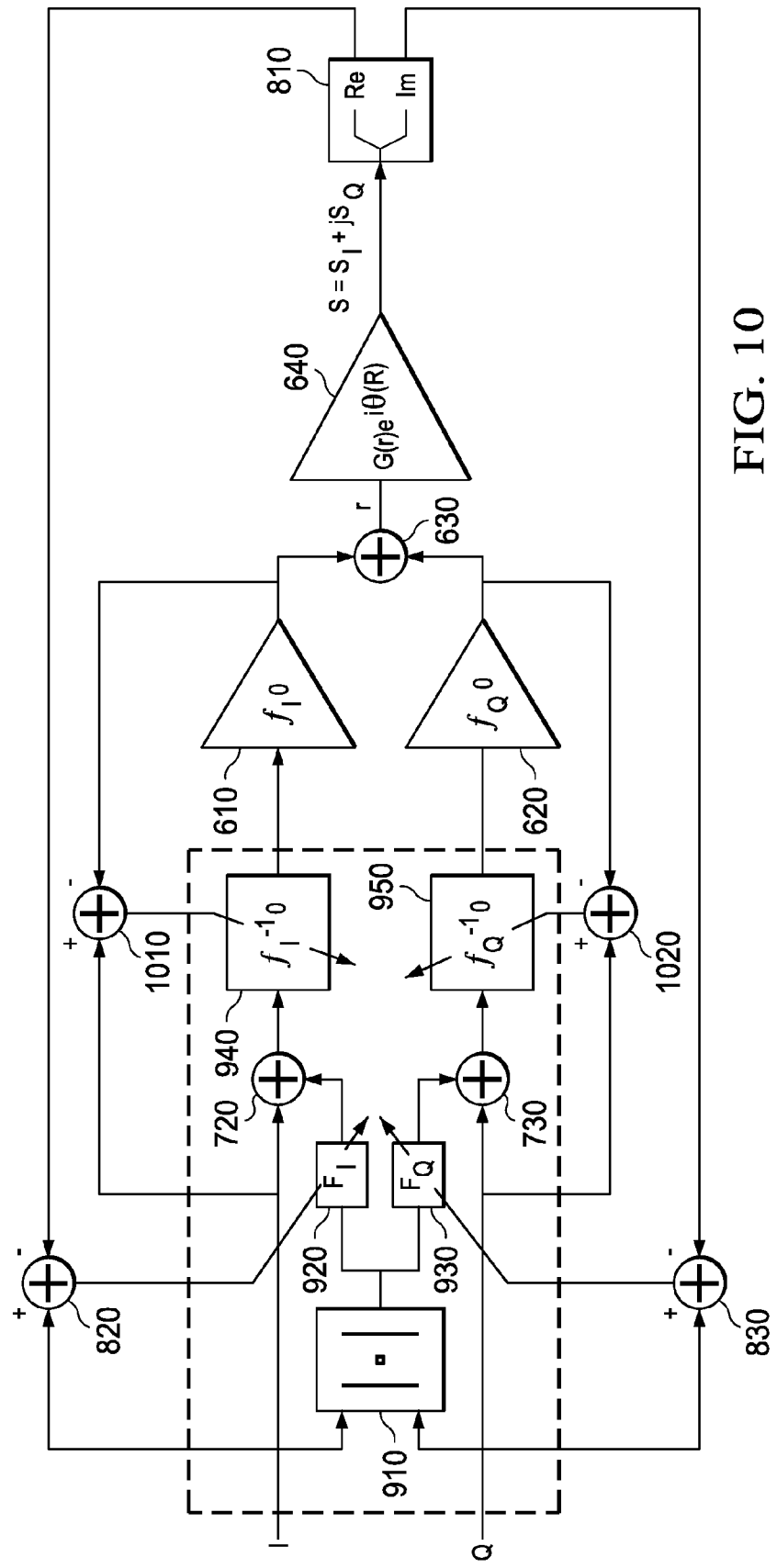
FIG. 10 is a block diagram of the Cartesian transmitter of FIG. 6 in which cascaded one-dimensional predistortion with adaptation is carried out.

FIG. 10 is a block diagram of the Cartesian transmitter of FIG. 6 in which cascaded one-dimensional predistortion with adaptation is carried out. Two separate adaptation loops, including summing junctions 1010, 1020, are used for digital adaptive estimation of the $f_I(\cdot)$, $f_Q(\cdot)$ and $G(r)e^{j\theta(r)}$ nonlinearities respectively. As a result, memory requirements are reduced, but some interaction may occur between the two overlapping adaptation loops, resulting in an increased adaptation time due to separate adaptation of the divide nonlinearities (or cascaded predistortion).

4.2.2 Adaptive Cartesian Projection Predistortion

In performing Cartesian transmitter predistortion, advantage can be taken of "smooth" nonlinearities which exhibit certain continuity and monotonicity properties, especially in the signal amplitude domain. Using these properties, Cartesian predistortion can be carried out in the complex domain, while predistorter nonlinearity can be separately implemented in the I and Q domains, respectively.

Figure 11:
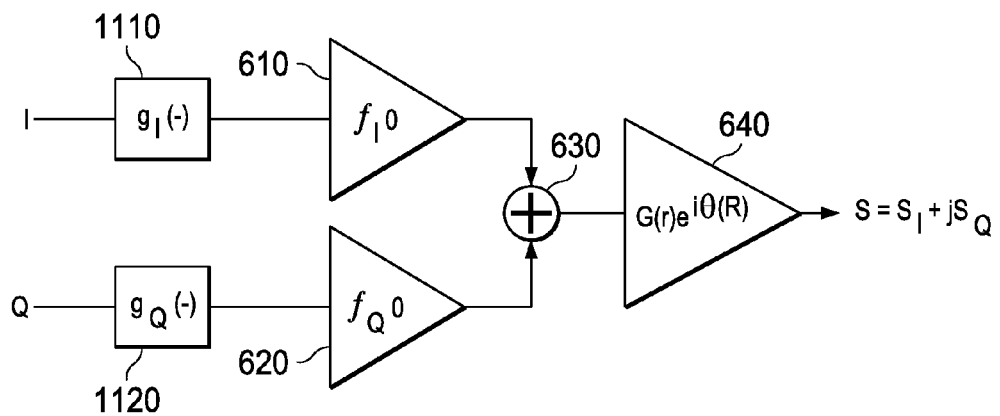
FIG. 11 is a block diagram of the Cartesian transmitter of FIG. 6 in which projection predistortion is carried out.

FIG. 11 is a block diagram of the Cartesian transmitter of FIG. 6 in which projection predistortion is carried out. $g_I(\cdot)$ and $g_Q(\cdot)$ transform LUTs 1110, 1120 (both in a direct mapping configuration) are performed on I and Q, respectively. As a result, memory requirements are minimal (2×128=256 words), and the convergence speed can be greatly improved, even if the LUTs are cascaded. Projection predistortion will now be described.

In an equivalent representation, the predistortion projection may be done in the complex domain, where the predistortion LUT is implemented as a complex gain comprising $g_I(\cdot)+jg_Q(\cdot)$.

4.2.2.3 Adaptive Cartesian Projection Predistortion

Using the assumption that the transmitter nonlinearities in the signal amplitude domain are smooth, monotonic and exhibit phase domain continuity as well, the complex domain transmitter baseband output $S=S_I+S_Q$ in equation (1) can be expressed as a complex-domain functional pair, where:

$$S_I = \zeta_I(f_I(I), f_Q(Q), G(r), \theta(r))$$

$$S_Q = \zeta_Q(f_I(I), f_Q(Q), G(r), \theta(r))$$

Figure 12:
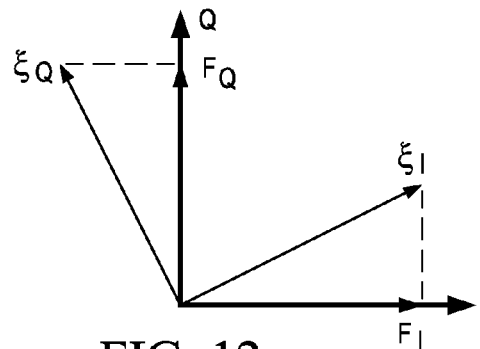
FIG. 12 is a block diagram of the Cartesian transmitter of FIG. 6 in which predistortion with output projection onto the I/Q domain is carried out.

Assuming the transmitter nonlinearity to be memoryless, each of the nonlinear terms in Equation (5) is a complex-valued vector at each instant of time. The rotation of these vectors is due to the collective AM-PM of the system, while the amplitude scaling is due to the AM-AM artifact of the transmitter nonlinearity. The complex-valued vectors $\zeta_I(\cdot)$ and $\zeta_Q(\cdot)$ are not constrained to be orthogonal. The orthogonality assumption can only be possible if the I/Q branches have no DC offset, gain and phase mismatch, this assumption can be physically imposed by carrying out the DC offset and gain/phase calibration step in the transmitter prior to linearization. If the temporal phase variation due to $\theta(r)$ is assumed to be small, a projection of the $\zeta_I(\cdot)$ and $\zeta_Q(\cdot)$ vectors can be made onto the I and Q domain to achieve the vector projections $F_I$ and $F_Q$ shown in FIG. 12. As a result, the $\zeta_I(\cdot)$ and $\zeta_Q(\cdot)$ vectors are aligned with $F_I$ and $F_Q$ vectors such that the scaling between $F_I$ and $F_Q$ and I and Q vectors is given by the linearized constant slope of the transmitter at all times.

Figure 13:
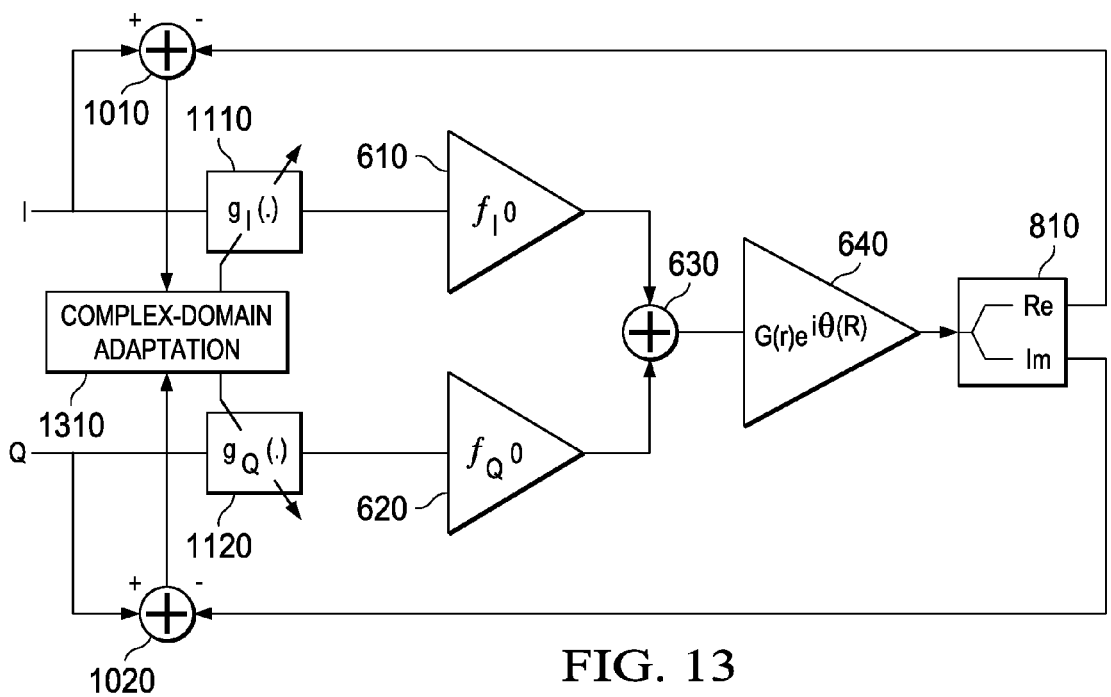
FIG. 13 is a block diagram of the Cartesian transmitter of FIG. 6 in which predistortion with output projection onto the I/Q domain with adaptation is carried out.

FIG. 13 is a block diagram of the Cartesian transmitter of FIG. 6 in which predistortion with output projection onto the I/Q domain with adaptation is carried out. A complex-domain adaptation block 1310 may perform the following stochastic gradient process, in which the predistorter is represented by a complex valued nonlinearity $g(\cdot) = g_I(\cdot) + j \cdot g_Q(\cdot)$:

Step 1: After predistortion calibration, initialize the compensation LUT (i.e., $g_I(\cdot)$ and $g_Q(\cdot)$, or their complex equivalent $g(\cdot)$) to be all zeros. If the predistortion is implemented as a polynomial or complex filter, all weights are initialized to zero.

Step 2: Assuming that at the $k^{th}$ instant, $\zeta_I(\cdot)$ and $\zeta_Q(\cdot)$ are "near" orthogonal to each other, compute adaptation error as:

$$e_k = (\zeta_{I,k}(\cdot) + j\zeta_{Q,k}(\cdot)) - (I_k + jQ_k). \tag{6}$$

Step 3: Compute the update to the corresponding LUT entry (or the weight vector as follows). For example, this may be achieved by defining the process objective function to be $C_k = E\{|e_k|^2\}$ and computing the gradient function by partial differentiation with respect to $g_k(\cdot)$ viz.:

$$g_k(\cdot) = g_{k-1}(\cdot) + \mu(I_k + jQ_k)e^*_k, \tag{7}$$

where $e^*_k$ is the conjugate of the complex value error in Equation (6)?

Step 4: Update the corresponding $g_I(\cdot)$ and $g_Q(\cdot)$ LUT entries as follows:

$$g_{I,k}(\cdot) = \text{real}(g_k(\cdot)) \text{ and}$$

$$g_{Q,k}(\cdot) = \text{imag}(g_k(\cdot)). \tag{8}$$

If the compensation LUT is implemented as a complex scaling gain, i.e., $g(\cdot)$, the compensation LUT can be directly updated using Equation (7).

A simplified version of the adaptation update law can be achieved by assuming an objective function based on the $L_1$-norm of the error vector, i.e., $\overline{C}_k = E\{|e_k|\}$. The update law thus resulting can be implemented as:

$$g_k(\cdot) = g_{k-1}(\cdot) + \mu e^*_k. \tag{9}$$

However, Equation (9) is not a true Euclidean gradient. Although a complex multiplication in Equation (7) has been eliminated, the consequence may be a slower (and local) convergence of the predistorter. Other gradient algorithms using, e.g., a Riemannian contra-variant gradient and other known signal processing techniques may be derived. Derivation of example gradient update laws has been done as an example only and should not limit the scope of the predistortion adaptation described herein.

Furthermore, the adaptation step-size p can be varied during adaptation to provide both a faster convergence speed and minimum steady-state error. In one embodiment, this is done by gear-shifting. In an alternative embodiment, this is done by using a time-varying normalization of the learning rate, i.e.:

$$\mu = \frac{\mu_0}{\eta_0 + |e_k^2|}, \quad (10)$$

where $\mu_0$ is the nominal adaptation step-size computed when $\eta_0 + |e_k^2| = 1$, $\eta_0$ is a fractional term used in the denominator to ensure that Equation (10) does not diverge if $e_k \ll 1$. While not necessary, the above normalization choice is made because the vector (I+jQ) for a transmitter is typically normalized to use the maximum digital signal dynamic range. However, as the error reduces with the settling of the stochastic gradient process, $\mu$ may be adjusted for faster convergence.

In conjunction with Equation (10), the nominal adaptation step-size $\mu_0$ may be gear-shifted when the stochastic gradient process is near convergence to ensure reduced steady state error because of reduced adaptation noise.

5 Performance Impact of Transmitter Output Power Level

The effect of the output power level on the predistorter adaptation will now be described. The received signal is corrupted by an additive noise of approximately 103 dBm occupying a 5 MHz bandwidth (implying a noise power spectral density of approximately 170 dBm/Hz). The transmitter's output power is varied from 24 dBm to −35 dBm. The experiments were run for five different value of the update factor $\mu$. A value of $\mu=0$ means that adaptation is turned off. The nominal predistorter is calibrated for a temperature of 25° while the initial operating temperature is set to 125°.

Figure 14:
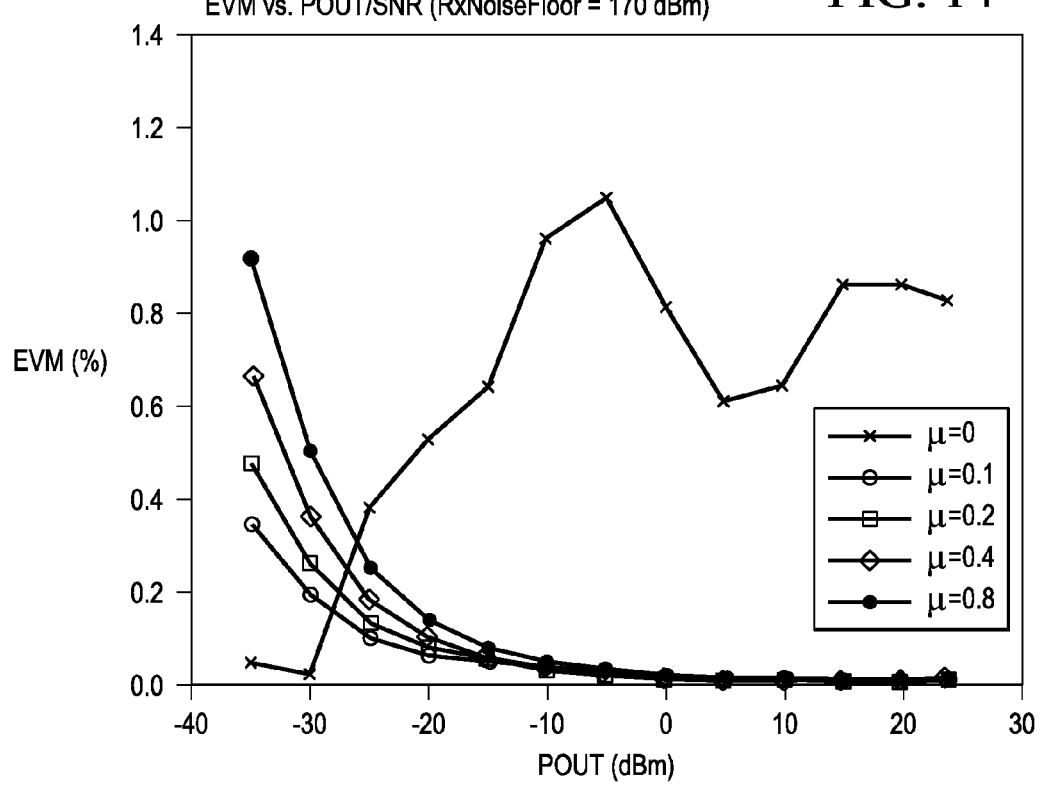
FIG. 14 is a plot showing EVM as a function of power level in one embodiment of a Cartesian transmitter.
Figure 15:
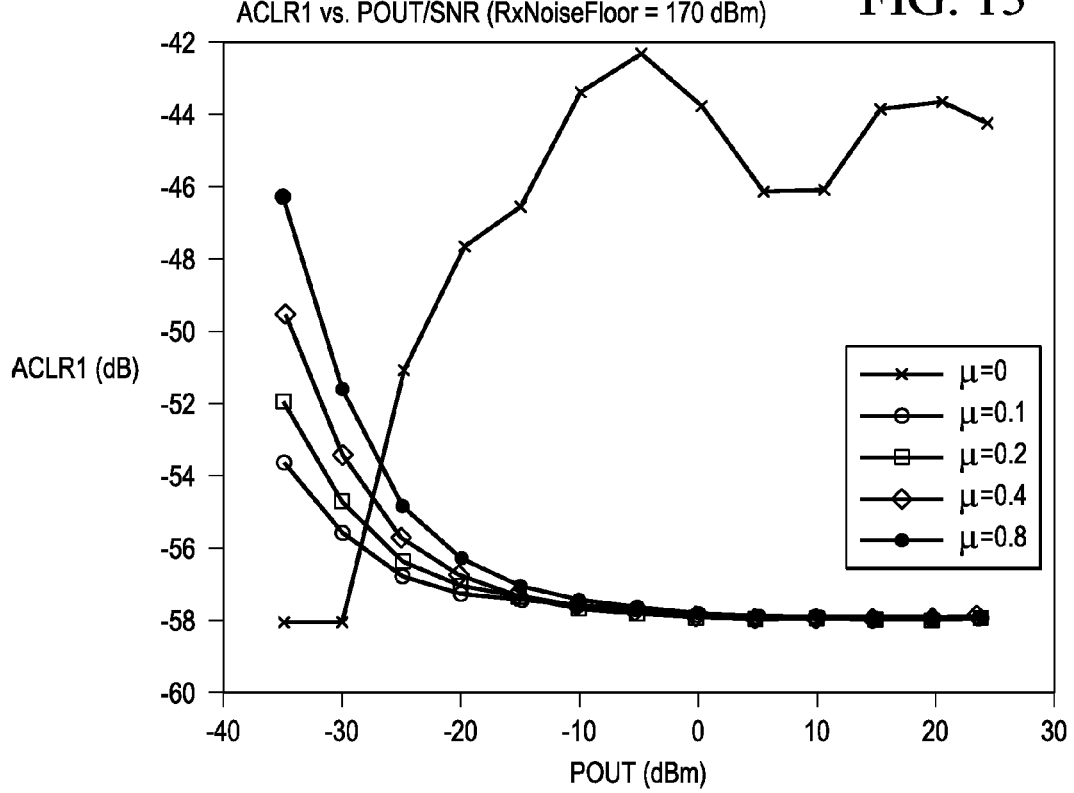
FIG. 15 is a plot showing ACLR1 as a function of power level in one embodiment of a Cartesian transmitter.
Figure 16:
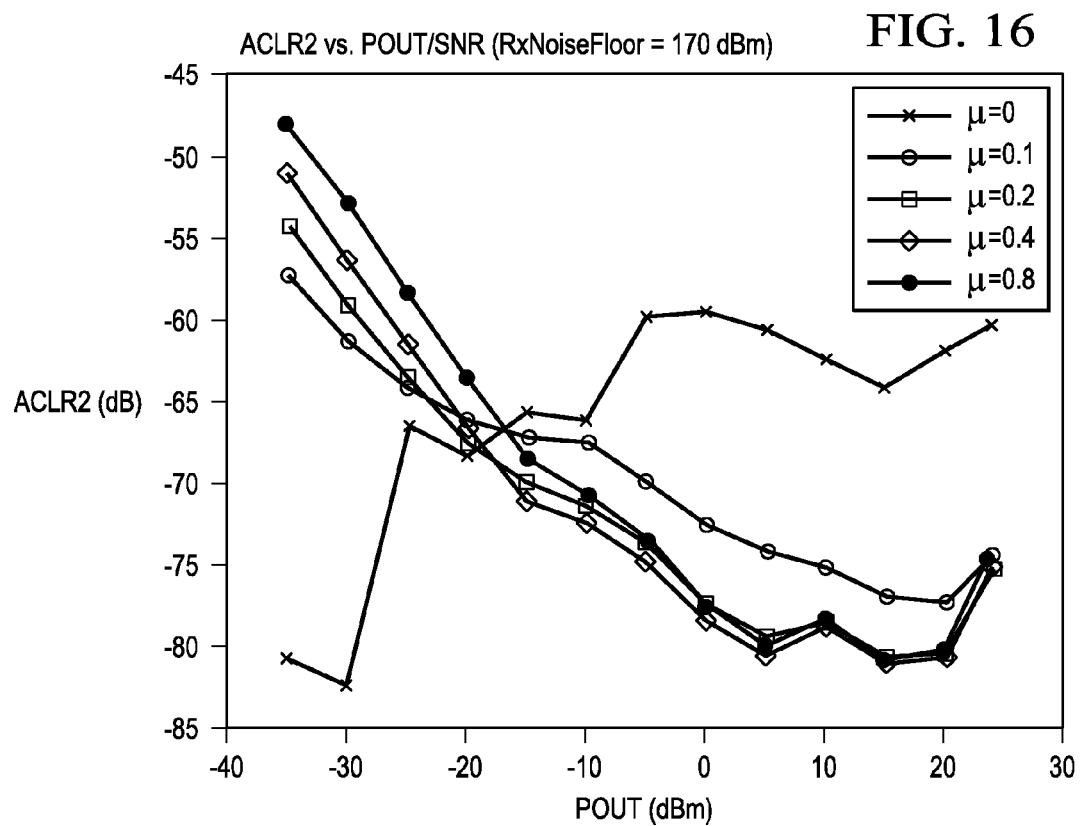
FIG. 16 is a plot showing ACLR2 as a function of power level in one embodiment of a Cartesian transmitter.

FIGS. 14, 15 and 16 are plots respectively showing EVM, ACLR1 and ACLR2 as a function of power level in one embodiment of a Cartesian transmitter. In the absence of adaptation, EVM, ACLR1 and ACLR2 are significantly degraded at higher power levels. In one embodiment, the predistorter should be adapted for power levels greater than −25 dBm. Decreasing the adaptation factor improves the steady state performance.

6 SNR Requirements on the Feedback Path

The SNR requirements depend mainly on the adaptation sampling rate and the update factor. The update algorithm acts like a low pass filter with respect to the noisy receiver feedback signal. Assuming the receiver is subject to additive white noise, a higher sampling rate results in a lower noise floor (dBm/Hz) and reduced noise power after filtering. On the other hand, decreasing the update factor narrows the filter's passband, resulting in a filtering of a larger amount of noise, but with a longer convergence time as a result. Relatively slow temperature variations can be successfully tracked using a low update rate, relaxing the SNR requirements on the receiver.

Figure 17:
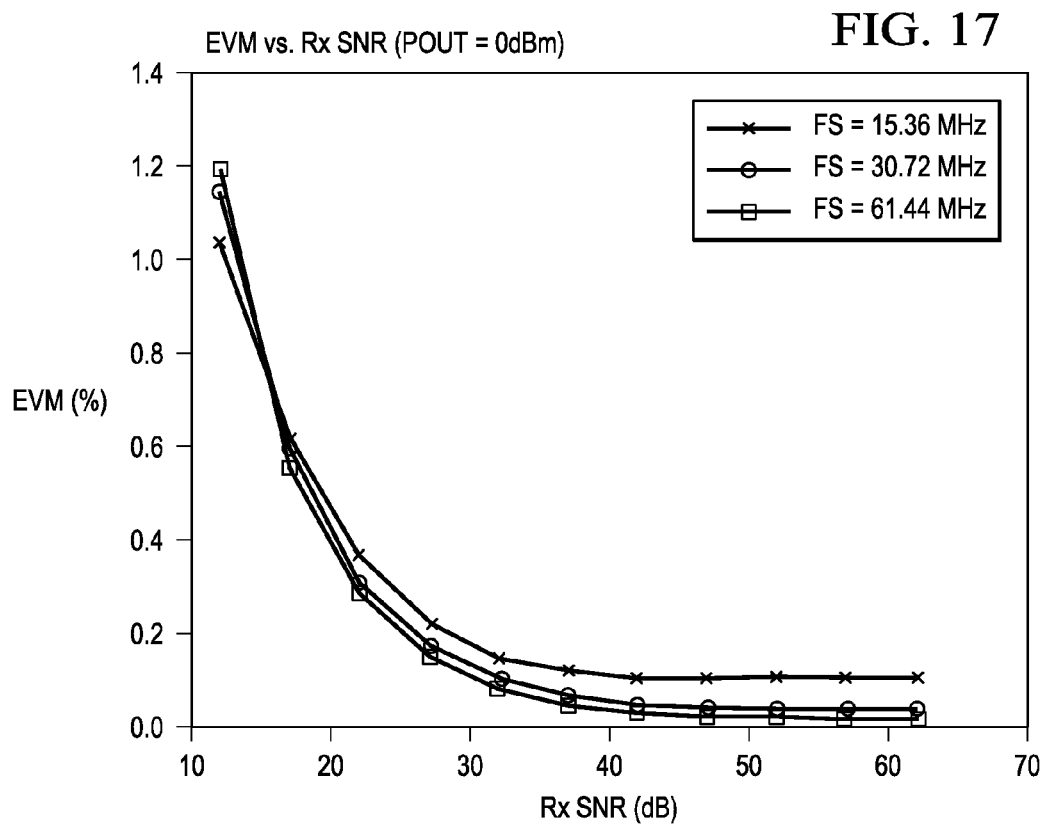
FIG. 17 is a plot showing EVM after adaptation as a function of receiver signal-to-noise ratio (SNR) in one embodiment of a Cartesian transmitter.
Figure 18:
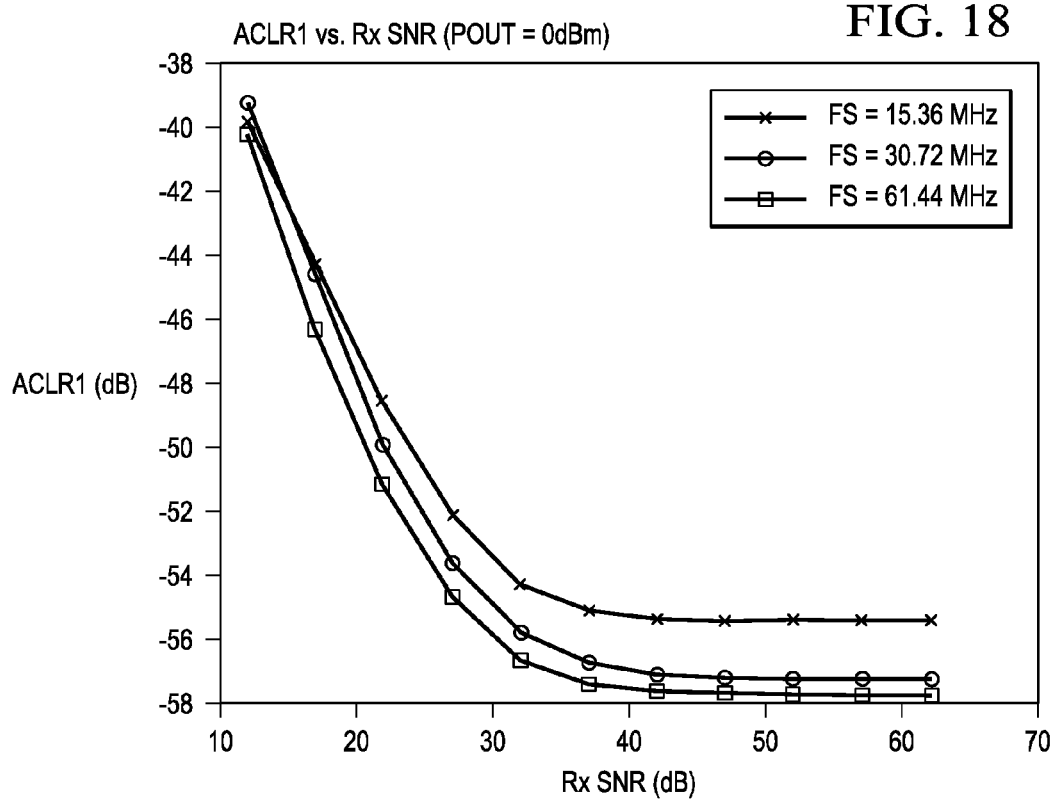
FIG. 18 is a plot showing ACLR1 after adaptation as a function of receiver SNR in one embodiment of a Cartesian transmitter.
Figure 19:
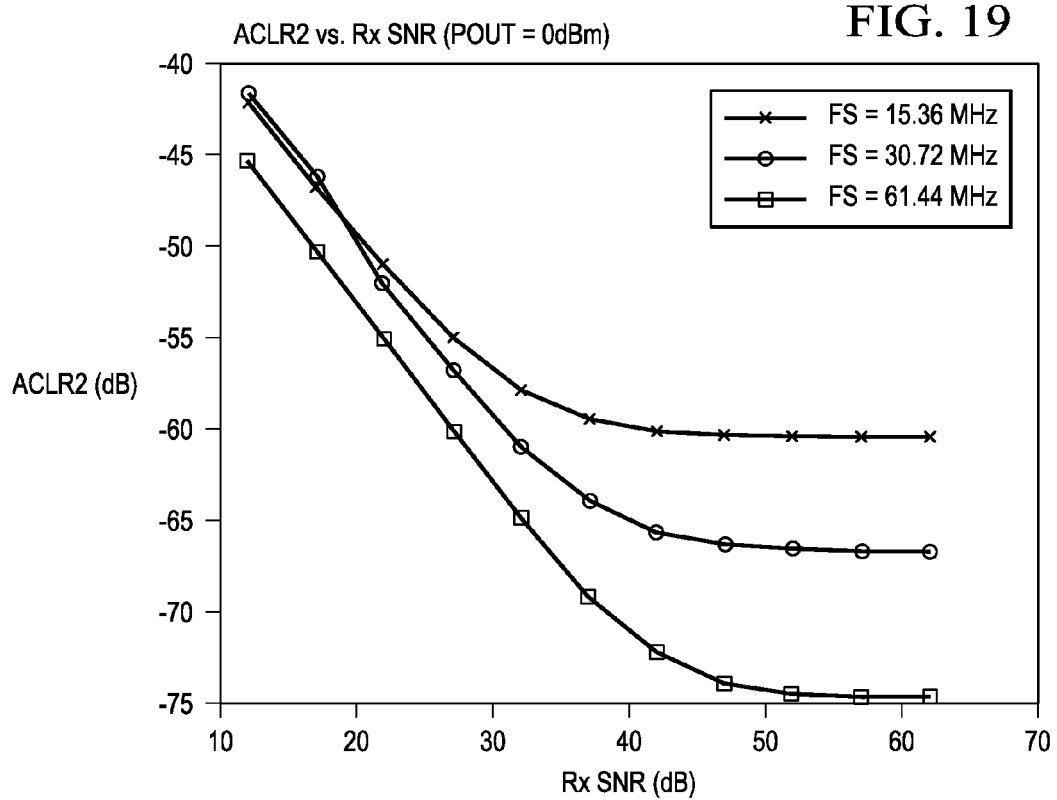
FIG. 19 is a plot showing ACLR2 after adaptation as a function of receiver SNR in one embodiment of a Cartesian transmitter.

FIGS. 17, 18 and 19 are plots respectively showing EVM, ACLR1 and ACLR2 after adaptation as a function of receiver SNR in one embodiment of a Cartesian transmitter. Experimental results below suggest that a receiver SNR on the order of 35 dB is required for good adaptation across the desirable output power range of a WCDMA transmitter. An update rate between 15 MHz and 60 MHz is sufficient to track slow temperature variation. A higher sampling rate could be considered at transmitter start-up to recover quickly from an initial temperature mismatch and/or to minimize the adaptation time.

Figure 20:
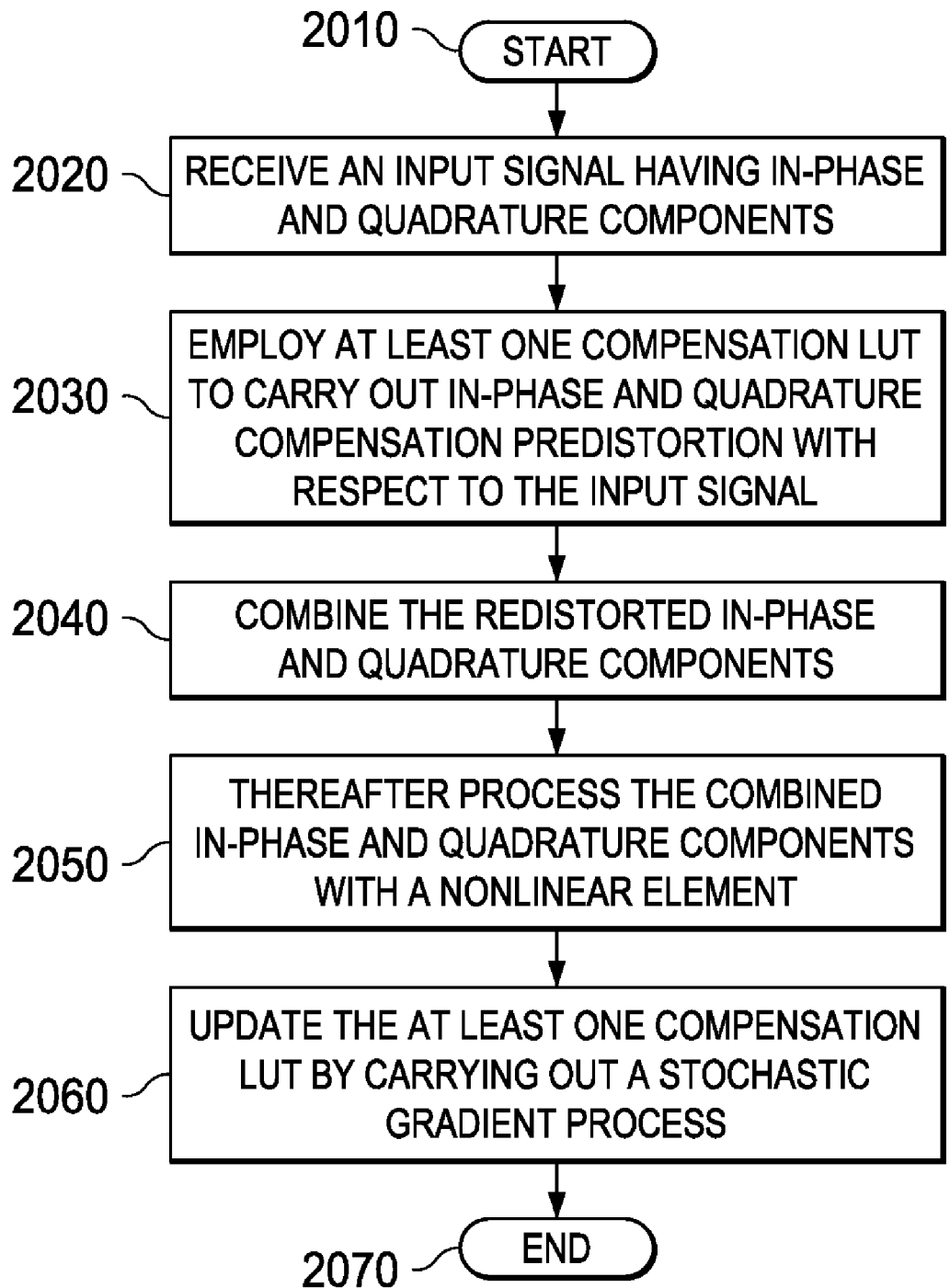
FIG. 20 is a flow diagram of one embodiment of a method of linearizing a Cartesian transmitter carried out according to the principles of the invention.

FIG. 20 is a flow diagram of one embodiment of a linearizing a Cartesian transmitter carried out according to the principles of the invention. The method begins in a start step 2010. In a step 2020, an input signal having in-phase and quadrature components is received into the transmitter. In a step 2030, at least one compensation lookup table is employed to carry out in-phase and quadrature compensation predistortion with respect to the input signal. In a step 2040, the predistorted in-phase and quadrature components are combined, e.g., in an RF combiner. In a step 2050, the combined in-phase and quadrature components are thereafter processed with a nonlinear element, e.g., one or more amplifiers. In a step 2060, the at least one compensation lookup table is updated by carrying out a stochastic gradient process. The stochastic gradient process may be carried out by initializing a compensation LUT based on a signal from a receiver, computing an adaptation error, computing an update to corresponding LUT entries and updating the corresponding LUT entries. The method ends in an end step 2070.

Those skilled in the art to which the invention relates will appreciate that other and further additions, deletions, substitutions and modifications may be made to the described embodiments without departing from the scope of the invention.

What is claimed is:

1. A Cartesian transmitter, comprising:
a transmit chain configured to receive an input signal having in-phase and quadrature components and having a predistorter configured to employ at least one compensation lookup table to carry out in-phase and quadrature compensation predistortion with respect to said input signal, a combiner configured to combine outputs of said predistorter and a nonlinear element configured to process an output of said combiner;
a receiver coupled to said transmit chain;
predistortion compensation circuitry associated with said receiver and configured to update said at least one compensation lookup table based on said input signal and a signal from said receiver; and
a splitter associated with said receiver and configured to divide an output signal of said transmitter into real and imaginary components and wherein said at least one compensation lookup table is at least one compensation lookup table in a direct mapping configuration and said predistortion compensation circuitry is configured to update said at least one compensation lookup table based on said input signal, a signal from said receiver and an objective function based on an $L_2$-norm of an error vector.

2. The transmitter as recited in claim 1 wherein said at least one compensation lookup table is at least one inverse gain compensation lookup table.

3. The transmitter as recited in claim 2 further comprising a splitter associated with said receiver and configured to divide an output signal of said transmitter into real and imaginary components, said at least one compensation lookup table being a single, two-dimensional complex compensation lookup table, said predistortion compensation circuitry configured to update said single, two-dimensional complex compensation lookup table based on said real and imaginary components.

4. The transmitter as recited in claim 2 further comprising a splitter associated with said receiver and configured to divide an output signal of said transmitter into real and imaginary components, said at least one compensation lookup table being in-phase and quadrature compensation lookup tables, said predistortion compensation circuitry configured to update said in-phase and quadrature compensation lookup tables based on said real and imaginary components.

5. The transmitter as recited in claim 4 further comprising in-phase and quadrature compensation lookup tables in a direct mapping configuration and further comprising further predistortion compensation circuitry configured to update said in-phase and quadrature compensation lookup tables based on said in-phase and quadrature components.

6. The transmitter as recited in claim 5 wherein said predistortion compensation circuitry is further configured to update said in-phase and quadrature compensation lookup tables based on at least one of:
   transmit chain operational parameters,
   output voltage standing-wave ratio variations, and
   load voltage standing-wave ratio variations.

7. The transmitter as recited in claim 1 further comprising a splitter associated with said receiver and configured to divide an output signal of said transmitter into real and imaginary components and wherein said at least one compensation lookup table is at least one compensation lookup table in a direct mapping configuration and said predistortion compensation circuitry is configured to update said at least one compensation lookup table in a complex domain based on said input signal and a signal from said receiver.

8. The transmitter as recited in claim 1 wherein said transmitter is a 2G, 3G or 4G transmitter.

9. The transmitter as recited in claim 1 wherein said transmit chain is configured to transmit a known waveform for calibrating said predistortion compensation circuitry.

10. A method of linearizing a Cartesian transmitter, comprising:
   receiving an input signal having in-phase and quadrature components;
   employing at least one compensation lookup table to carry out in-phase and quadrature compensation predistortion with respect to said input signal;
   combining said predistorted in-phase and quadrature components;
   thereafter processing said combined in-phase and quadrature components with a nonlinear element;
   updating said at least one compensation lookup table by initializing a compensation LUT based on a signal from a receiver, computing an adaptation error, computing an update to corresponding LUT entries and updating said corresponding LUT entries; and
   splitting an output signal of said transmitter into real and imaginary components, said at least one compensation lookup table is at least one compensation lookup table in a direct mapping configuration and said updating comprises updating said at least one compensation lookup table in a complex domain based on said input signal, a signal from said receiver and an objective function based on an $L_2$-norm of an error vector.

11. The method as recited in claim 10 wherein said at least one compensation lookup table is at least one inverse gain compensation lookup table.

12. The method as recited in claim 11 further comprising splitting an output signal of said transmitter into real and imaginary components, said at least one compensation lookup table being a single, two-dimensional complex compensation lookup table, said updating comprising updating said single, two-dimensional complex compensation lookup table based on said real and imaginary components.

13. The method as recited in claim 11 further comprising splitting an output signal of said transmitter into real and imaginary components, said at least one compensation lookup table being in-phase and quadrature compensation lookup tables, said updating comprising updating said in-phase and quadrature compensation lookup tables based on said real and imaginary components.

14. The method as recited in claim 13 further comprising:
   employing in-phase and quadrature compensation lookup tables in a direct mapping configuration to predistort said in-phase and quadrature components before said combining; and
   updating said in-phase and quadrature compensation lookup tables based on said in-phase and quadrature components.

15. The method as recited in claim 14 wherein said updating is carried out based on at least one of:
   transmit chain operational parameters,
   output voltage standing-wave ratio variations, and
   load voltage standing-wave ratio variations.

16. The method as recited in claim 10 further comprising splitting an output signal of said transmitter into real and imaginary components, said at least one compensation lookup table is at least one compensation lookup table in a direct mapping configuration and said updating comprises updating said at least one compensation lookup table in a complex domain based on said input signal and a signal from said receiver.

17. The method as recited in claim 10 wherein said transmitter is a 2G, 3G or 4G transmitter.

18. The method as recited in claim 10 wherein said transmit chain is configured to transmit a known waveform for calibrating said predistortion compensation circuitry.

19. A WCDMA Cartesian transmitter, comprising:
   a transmit chain configured to receive an input signal having in-phase and quadrature components and having a predistorter configured to employ at least one compensation lookup table to carry out in-phase and quadrature compensation predistortion with respect to said input signal, a nonlinear combiner configured to combine outputs of said predistorter, a nonlinear pre-power amplifier configured to amplify an output of said combiner and a nonlinear power amplifier configured to amplify an output of said pre-power amplifier to yield an output signal;
   a receiver coupled to said transmit chain;
   predistortion compensation circuitry associated with said receiver and configured to update said at least one compensation lookup table based on said input signal and a signal from said receiver; and
   a splitter associated with said receiver and configured to divide an output signal of said transmitter into real and imaginary components and wherein said at least one compensation lookup table is at least one compensation lookup table in a direct mapping configuration and said predistortion compensation circuitry is configured to update said at least one compensation lookup table based on said input signal, a signal from said receiver and an objective function based on an $L_1$-norm of an error vector.

20. The WCDMA transmitter as recited in claim 19 wherein said at least one compensation lookup table is at least one inverse gain compensation lookup table.

21. The WCDMA transmitter as recited in claim 20 further comprising a splitter associated with said receiver and configured to divide said output signal into real and imaginary components, said at least one compensation lookup table being a single, two-dimensional complex compensation lookup table, said predistortion compensation circuitry configured to update said single, two-dimensional complex compensation lookup table based on said real and imaginary components.

22. The WCDMA transmitter as recited in claim 20 further comprising a splitter associated with said receiver and configured to divide said output signal into real and imaginary components, said at least one compensation lookup table being in-phase and quadrature compensation lookup tables, said predistortion compensation circuitry configured to update said in-phase and quadrature compensation lookup tables based on said real and imaginary components.

23. The WCDMA transmitter as recited in claim 22 wherein said predistortion compensation circuitry is further configured to update said in-phase and quadrature compensation lookup tables based on at least one of:
- transmit chain operational parameters,
- output voltage standing-wave ratio variations, and
- load voltage standing-wave ratio variations.

24. The WCDMA transmitter as recited in claim 22 further comprising in-phase and quadrature compensation lookup tables in a direct mapping configuration and further comprising further predistortion compensation circuitry configured to update said in-phase and quadrature compensation lookup tables based on said in-phase and quadrature components.

25. The WCDMA transmitter as recited in claim 19 further comprising a splitter associated with said receiver and configured to divide said output signal into real and imaginary components and wherein said at least one compensation lookup table is at least one compensation lookup table in a direct mapping configuration and said predistortion compensation circuitry is configured to update said at least one compensation lookup table in a complex domain based on said input signal and a signal from said receiver.

26. A WCDMA Cartesian transmitter, comprising:
- a transmit chain configured to receive an input signal having in-phase and quadrature components and having a predistorter configured to employ at least one compensation lookup table to carry out in-phase and quadrature compensation predistortion with respect to said input signal, a nonlinear combiner configured to combine outputs of said predistorter, a nonlinear pre-power amplifier configured to amplify an output of said combiner and a nonlinear power amplifier configured to amplify an output of said pre-power amplifier to yield an output signal;
- a receiver coupled to said transmit chain;
- predistortion compensation circuitry associated with said receiver and configured to update said at least one compensation lookup table based on said input signal and a signal from said receiver;
- an adaptation engine associated with said predistortion compensation circuitry and configured to employ an iterative adaptation algorithm to reduce a difference between delayed signals provided thereto; and
- a quality monitor associated with said adaptation engine and configured to carry out a selected one of:
  - regulating predistortion operational parameters,
  - enabling or disabling said adaptation engine,
  - controlling switching of predistortion compensation LUTs, and
  - performing other sequencing operations.

27. The WCDMA transmitter as recited in claim 26 wherein said iterative adaptation algorithm is selected from the group consisting of:
- a stochastic gradient algorithm,
- a least-mean-square algorithm, and
- a recursive least squares algorithm.

28. The WCDMA transmitter as recited in claim 26 wherein said quality monitor is further configured to reduce said difference using metrics selected from the group consisting of:
- transmitted power level,
- transceiver output impedance variations,
- transceiver load impedance variations
- transceiver voltage standing-wave ratio, and
- signal-to-noise ratio.

29. The WCDMA transmitter as recited in claim 26 wherein said quality monitor is further configured to carry out a selected one of:
- changing adaptation step-size,
- tuning of reference and feedback signal time-alignment,
- enabling or disabling predistortion adaptation, and
- keeping or discarding predistortion adaptation results.

\* \* \* \* \*